United States Patent
Kang

(10) Patent No.: US 7,408,192 B2
(45) Date of Patent: Aug. 5, 2008

(54) ORGANIC LIGHT EMITTING DISPLAY DEVICE AND METHOD OF FABRICATING THE SAME

(75) Inventor: Tae-Wook Kang, Suwon-si (KR)

(73) Assignee: Samsung SDI Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 11/297,343

(22) Filed: Dec. 9, 2005

(65) Prior Publication Data
US 2006/0124933 A1  Jun. 15, 2006

(30) Foreign Application Priority Data
Dec. 13, 2004  (KR)  ........................ 10-2004-0105146

(51) Int. Cl.
*H01L 29/04* (2006.01)
*H01L 29/10* (2006.01)
*H01L 31/00* (2006.01)

(52) U.S. Cl. .............................. 257/59; 257/72; 257/83; 257/E33.064; 257/E51.022; 257/E51.026; 313/500; 313/505

(58) Field of Classification Search ........................ None
See application file for complete search history.

(56) References Cited

U.S. PATENT DOCUMENTS

| 5,990,988 | A  | * | 11/1999 | Hanihara et al. | ............... 349/48 |
| 2002/0104995 | A1 | * | 8/2002 | Yamazaki et al. | ............. 257/72 |
| 2003/0052843 | A1 | * | 3/2003 | Yamazaki et al. | ............. 345/82 |

FOREIGN PATENT DOCUMENTS

| EP | 1 065 723 | 1/2001 |
| EP | 1 401 033 | 3/2004 |
| WO | WO 03/036711 | 5/2003 |

OTHER PUBLICATIONS

European Office Action of the European Patent Application No. 05 11 1816, issued on May 24, 2006.

* cited by examiner

*Primary Examiner*—Minh-Loan Tran
*Assistant Examiner*—Leslie Pilar Cruz
(74) *Attorney, Agent, or Firm*—Robert E. Bushnell, Esq.

(57) ABSTRACT

An organic light emitting display device and a method of fabricating the same. A dummy pattern is formed in an emission region to increase the step height of the emission region by an electrode material while a thin film transistor is fabricated, so that a distance between a pixel electrode and a donor film is decreased during fabrication of an organic layer. This reduced distance reduces laser energy for transfer using laser-induced thermal imaging, thus improving life span and efficiency of the device. Further, the pixel electrode can extend into a thin film transistor region and a capacitor region, thus enhancing an aperture ratio.

14 Claims, 3 Drawing Sheets

ORGANIC LIGHT EMITTING DISPLAY DEVICE AND METHOD OF FABRICATING THE SAME

CLAIM OF PRIORITY

This application makes reference to, incorporates the same herein, and claims all benefits accruing under 35 U.S.C. §119 from an application earlier filed in the Korean Intellectual Property Office on 13 Dec. 2004 and there duly assigned Serial No. 10-2004-0105146.

BACKGROUND OF THE INVENTION

1. Field of the Invention

The present invention relates to an organic light emitting display device and a method of fabricating the same, and more particularly, to an organic light emitting display device with a pixel region having an increased step difference to facilitate the deposition of an organic layer using a laser-induced thermal imaging method.

2. Description of the Related Art

Among flat panel display devices, an organic light emitting display device has a fast response time shorter than 1 ms, consumes little power, and has a wide viewing angle range because it can emit light by itself. As a result, the organic light emitting display device has the advantage of a moving picture displaying medium regardless of the size thereof. Further, the organic light emitting display device can be fabricated at a low temperature, and its fabricating process is simple based on the existing semiconductor processing technology, thus attracting attention as a next generation flat panel display device.

According to materials and processes, the organic light emitting display device can be widely classified into a polymer device using a wet process, and a small molecule device using a deposition process. As a method for patterning a polymer or small molecule emission layer, an inkjet printing method is applied using limited materials for organic layers except for the emission layer, and has a complicated structure to be applied to a substrate. Further, a metal mask is needed to pattern the emission layer by the deposition process, so that there is much trouble in fabricating a large-sized device.

Meanwhile, a laser-induced thermal imaging (LITI) method has been recently developed as an alternative to the foregoing patterning method. The laser-induced thermal imaging method converts laser light from a light source into heat energy, and uses the heat energy to transfer a pattern forming material to an objective substrate, thus forming a pattern on the substrate. In the laser-induced thermal imaging method, a donor substrate formed with a transfer layer, a light source and an objective substrate are needed. Further, in the laser-induced thermal imaging method, the donor substrate and the objective substrate are laminated so that the donor substrate is adhered to the highest portion of the objective substrate.

However, in typical LITI processes for forming an organic light emitting display device, a large gap exists between the donor substrate and the pixel electrode. This large gap requires more laser energy for the LITI process, leading to damage and deterioration of the organic emission layer. Therefore, what is needed is an improved structure where this large gap is not apt to occur.

SUMMARY OF THE INVENTION

It is therefore an object of the present invention to provide an improved design for an organic light emitting display device and an improved method of making the same.

It is further an object of the present invention to provide an improved design and method of making that reduces the gap in the LITI process.

These and other objects can be achieved by an organic light emitting display device and a method of fabricating the same, in which a dummy pattern is provided under a pixel electrode of an emission region, so that a distance between a donor substrate and the pixel electrode is minimized, thus enhancing the efficiency of laser energy in a LITI process, and improving the life span and efficiency of an organic layer.

In an exemplary embodiment of the present invention, an organic light emitting display device includes an emission region including a pixel electrode, an organic layer that includes at least an emission layer, and an opposite electrode on a substrate, the emission region being defined by a pixel defining layer, a dummy pattern being arranged in the emission region under the pixel electrode, a thin film transistor region including a gate electrode and source and drain electrodes, and a capacitor region including a lower electrode and an upper electrode.

In another exemplary embodiment of the present invention, a method of fabricating an organic light emitting display device includes forming first conductive layer patterns on a substrate that is divided into a first region, a second region and a third region, respectively, forming a first insulating layer on the substrate and on the first conductive layer patterns, forming second conductive layer patterns on the first insulating layer in the first region, the second region and the third region, respectively, forming a second insulating layer on an entire surface of the second conductive layer and on exposed portions of the first insulating layer, forming third conductive layer patterns on the second insulating layer in first region, the second region and the third region, respectively, forming a third insulating layer on an entire surface of the third conductive layer and on exposed portions of the second insulating layer, forming a pixel electrode on the third insulating layer in the first region, the pixel electrode adapted to be connected to the third conductive pattern in the second region, forming a fourth insulating layer on the pixel electrode and on exposed portions of the third insulating layer, patterning the fourth insulating layer to expose at least a portion of the pixel electrode in the first region, forming an organic layer on the exposed portion of the pixel electrode, the organic layer including at least an emission layer and forming an opposite electrode on at least the organic layer.

BRIEF DESCRIPTION OF THE DRAWINGS

A more complete appreciation of the invention and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1:
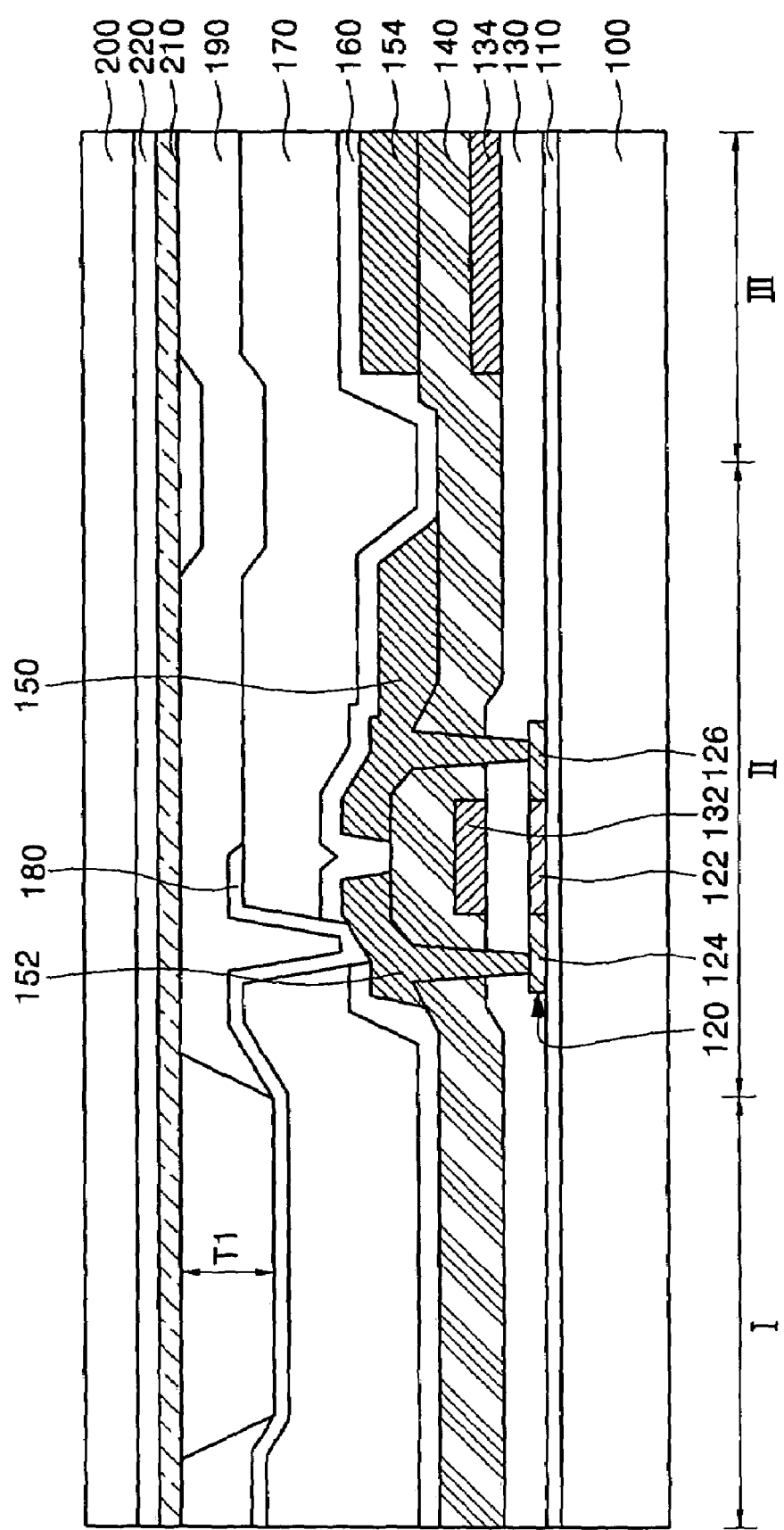
FIG. 1 is a cross-sectional view of a method of making an organic light emitting display device.

A method of fabricating an organic light emitting display device will be described in conjunction with FIG. 1. FIG. 1 is a cross-sectional view of an organic light emitting display device, which includes an emission region I, a thin film transistor region II, and a capacitor region III.

To begin, a buffer layer 110 is formed on a substrate 100. Preferably, the buffer layer 110 is used to prevent impurities in the substrate 100 from migrating into the device formed in a subsequent process. Subsequently, an amorphous silicon layer (not shown) is formed as a semiconductor layer having a predetermined thickness on the buffer layer 110. Then, the amorphous silicon layer is crystallized by excimer laser annealing (ELA), sequential lateral solidification (SLS), metal induced crystallization (MIC), metal induced lateral crystallization (MILC), or the like. The crystallized silicon layer is patterned by a photolithography process, thus forming a polysilicon layer pattern 120 in the thin film transistor region II of a unit pixel. At this time, the polysilicon layer pattern can be additionally formed as a capacitor electrode in the capacitor region III.

Next, a gate insulating layer 130 is formed on the entire surface of the resultant structure. At this time, the gate insulating layer 130 can be formed of a silicon oxide ($SiO_2$) layer, a silicon nitride ($SiN_x$) or a laminated layer thereof Then, the polysilicon layer pattern 120 of the thin film transistor region II is doped with impurities. At this time, source and drain regions 126 and 124 are formed in the thin film transistor region II. Further, a channel region 122 is formed between the source and drain regions 126 and 124.

Then, a conductive layer (not shown) for a gate electrode is formed on the entire surface of the resultant structure. The conductive layer for the gate electrode is formed of a single layer of molybdenum (Mo) or an alloy such as molybdenum-tungsten (MoW), a single layer of aluminum (Al) or an alloy such as aluminum-neodymium (Al—Nd), or a double layer of the above-mentioned metals.

Then, the conductive layer for the gate electrode is etched by photolithography and etching processes, thus forming a gate electrode 132 in the thin film transistor region II and a lower electrode 134 in the capacitor region III, respectively. In the case where the thin film transistor is an n-channel metal oxide semiconductor (NMOS), impurity ions can be lightly doped using the gate electrode 132 as an ion implantation mask, thus forming a lightly-doped drain (LDD) region (not shown).

Then, an interlayer insulating layer 140 is formed on the entire surface of the resultant structure. Subsequently, the interlayer insulating layer 140 and the gate insulating layer 130 are etched by photolithography and etching processes, thus forming a contact hole for exposing the source and drain regions 126 and 124.

Then, a material for forming source and drain electrodes is formed on the interlayer insulating layer 140. The source and drain electrode material is etched by photolithography and etching processes, thus forming source and drain electrodes 150 and 152 in the thin film transistor region II and an upper electrode 154 in the capacitor region III, respectively. Here, the source and drain electrodes 150 and 152 are connected to the source and drain regions 124 and 126 respectively.

Then, a passivation layer 160 and a planarization layer 170 are formed on the entire surface of the resultant structure. Then, the planarization layer 170 and the passivation layer 160 are etched by photolithography and etching processes, thus forming a via contact hole to expose one of the source and drain electrodes 150 and 152. In FIG. 1, the drain electrode 152 and not the source electrode 150 is shown to be exposed by the via contact hole.

A pixel electrode 180 is then formed to be connected to the drain electrode 152 through the via contact hole. At this time, the pixel electrode 180 is formed as a reflective electrode. Then, a pixel defining layer 190 is formed on the entire surface of the resultant structure, and is patterned to expose a portion of the pixel electrode 180 in emission region I.

Then, an organic layer (not shown) including at least the emission layer is formed on the pixel electrode 180. The organic layer is formed by an LITI method using the donor substrate that includes base substrate 200, a light-to-heat conversion layer 210 and a transfer layer 220. Then, an opposite electrode (not shown) is formed, and an encapsulating process is performed, thus completing the organic light emitting display device of FIG. 1.

In the organic light emitting display device of FIG. 1, the thin film transistor region II and the capacitor region III are formed to be lower than the emission region I. In other words, the thin film transistor region II and the capacitor region III are different in height by the metal electrodes, the gate electrode 132, the source and drain electrodes 150 and 152, the lower electrode 134 and the upper electrode 154, which are laminated in the thin film transistor region II and the capacitor region III but not in the emission region I.

The step difference manifests itself at interconnections around the unit pixel and a peripheral portion thereof For example, the thickness of a data line causes a data line region to be relatively higher than the emission region I. Such a structure can cause some problems in the LITI process for forming the organic layer. As the height T1 for detaching the emission region I and the transfer layer 220 from the donor substrate becomes larger, laser energy needed for transfer increases. A high laser energy is likely to damage the emission layer of the organic light emitting display device. Thus, the efficiency and life span of the resultant organic light emitting display device are decreased.

Figure 2:
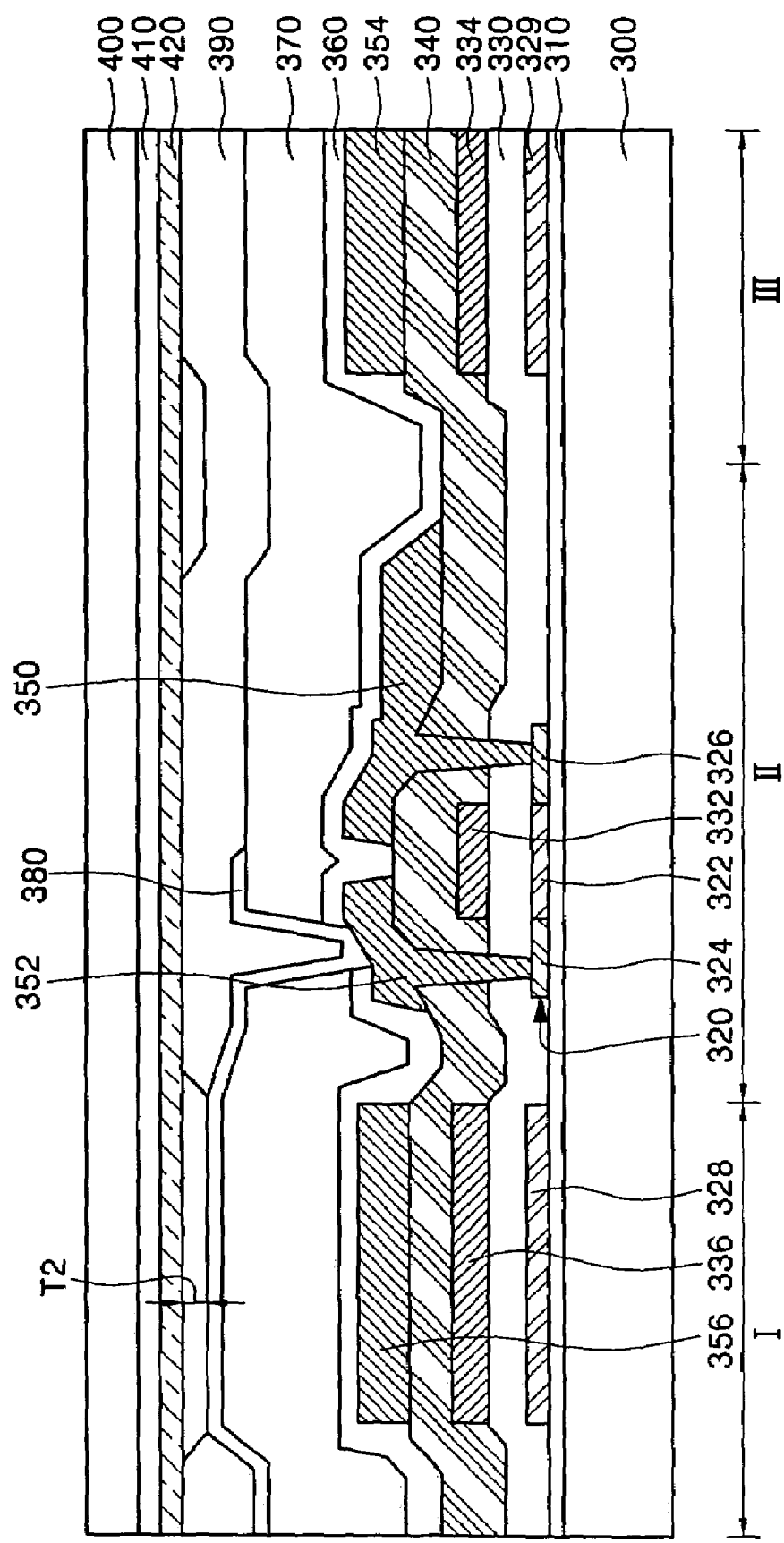
FIG. 2 is a cross-sectional view of a method of making an organic light emitting display device according to an embodiment of the present invention.
Figure 3:
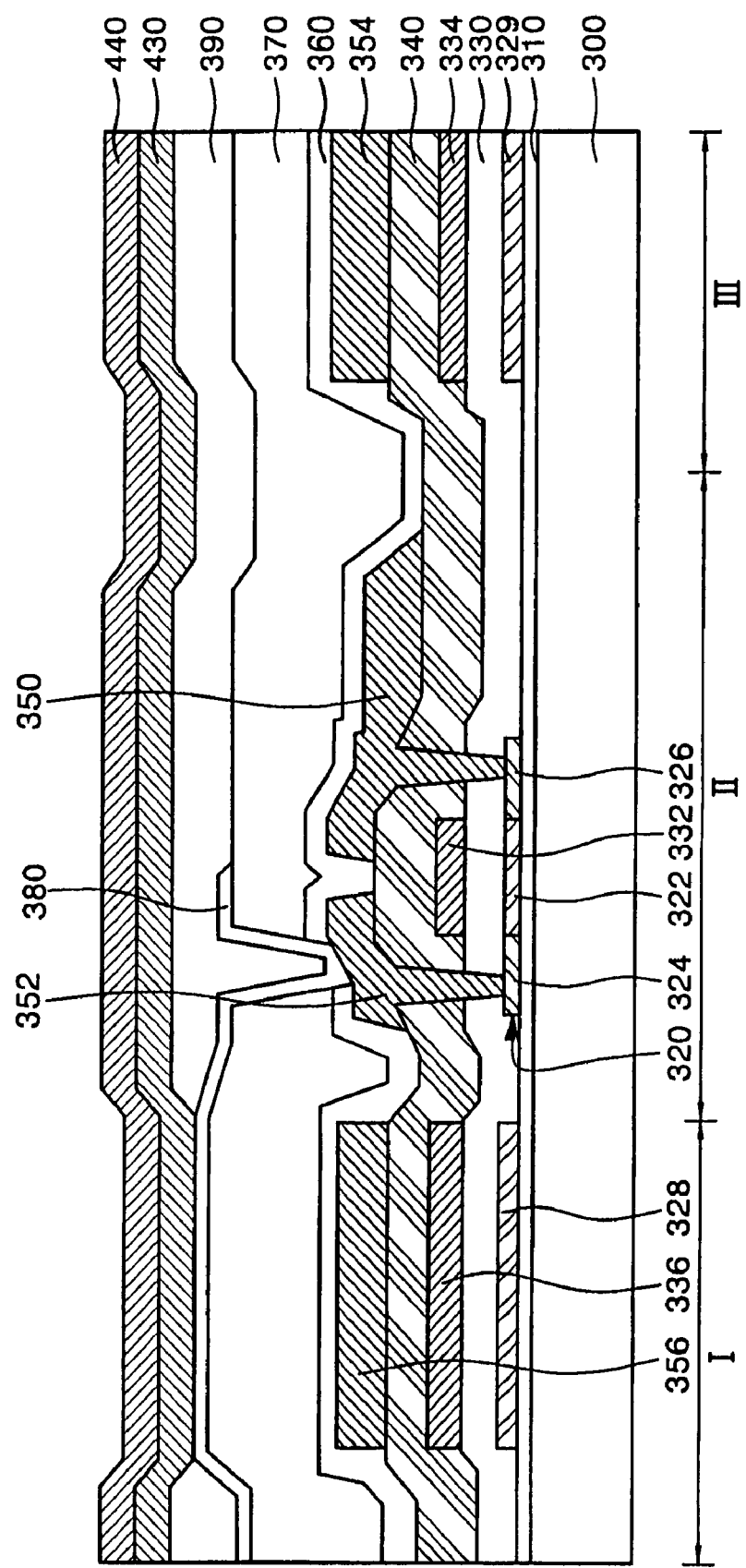
FIG. 3 is a view of a finished organic light emitting display device produced by the method of FIG. 2 according to the principles of the present invention.

Turning now to FIGS. 2 and 3, FIG. 2 is a cross-sectional view of a method of making an organic light emitting display device according to an embodiment of the present invention and FIG. 3 is the finished organic light emitting display device made according to the method of FIG. 2. As illustrated in FIGS. 2 and 3, the organic light emitting display device is divided into an emission region I, a thin film transistor region II, and a capacitor region III for convenience.

Referring to FIG. 2, a first dummy pattern 328 formed of a polysilicon layer, a second dummy pattern 336 formed of a gate electrode material, and a third dummy pattern 356 formed of a material for forming source and drain electrodes are laminated in the emission region I of a substrate 300, and a pixel electrode 380 is formed above the dummy patterns. Further, a thin film transistor including a gate electrode 332 and source and drain electrodes 350 and 352 are formed in the thin film transistor region II of the substrate 300. Also, a first capacitor includes a first electrode 329 formed of a poly silicon layer pattern, a second electrode 334 formed of a gate electrode material, and a gate insulating layer 330 between the first and second electrodes 329 and 334. And, a second capacitor includes a third electrode 354 made of the source and drain electrode material, and an interlayer insulating layer 340 between the second electrode 334 and the third electrode 354 and (located in the capacitor region III. To form an organic layer reference numeral 430 in FIG. 3) in the emission region I by a LITI method, a donor substrate including a base substrate 400, a light-to-heat conversion layer 410 and a transfer layer 420 are arranged and laminated on the substrate 300.

As shown in FIG. 2, the first dummy pattern 328, the second dummy pattern 336 and the third dummy pattern 356 are laminated in the emission region I, but the present invention is not limited thereto. Alternatively, two or more patterns among the dummy patterns can be laminated. Here, the pixel electrode 380 can be formed of a reflective electrode or a laminated layer including a reflective electrode so that the organic light emitting display device is a top emission type. The pixel electrode 380 can extend into the thin film transistor region II and the capacitor region III, thus enlarging an aperture ratio. Further, the double capacitor structure in the capacitor region III can be replaced by a single capacitor structure including the second electrode 334 and the third electrode 354.

Meanwhile, a pixel defining layer 390 defining the emission region is formed on the pixel electrode 380. Here, the pixel defining layer 390 is formed to a thickness of 3,000 Å or less. Preferably, a distance T2 between the transfer layer 420 of the donor substrate and the pixel electrode 380 is 3,000 Å or less. Even though the emission region I, the thin film transistor region II and the capacitor region III have the same step difference, the transfer layer 420 and the pixel electrode 380 are spaced apart from each other by a distance as much as the thickness of the pixel defining layer 390.

A method of fabricating the organic light emitting display of FIG. 2 according to an embodiment of the present invention will now be described. A buffer layer 310 is formed on the substrate 300 including in the emission region I, in the thin film transistor region II and in the capacitor region III. The buffer layer 310 is formed to prevent impurities in the substrate 300 from migrating into the device formed above in a subsequent process.

Subsequently, an amorphous silicon layer (not shown) is formed as a semiconductor layer having a predetermined thickness on the buffer layer 310. Then, the amorphous silicon layer is crystallized by excimer laser annealing (ELA), sequential lateral solidification (SLS), metal induced crystallization (MIC), metal induced lateral crystallization (MILC), or the like. The crystallized silicon layer is patterned by a photolithography process, thus forming the first dummy pattern 328, the polysilicon layer pattern 320 and the first electrode 329 in the emission region I, the thin film transistor region II and the capacitor region III, respectively.

Then, a gate insulating layer 330 is formed on the entire surface of the resultant structure. At this time, the gate insulating layer 330 can be formed of a silicon oxide ($SiO_2$) layer, a silicon nitride ($SiN_x$) or a laminated layer thereof.

Then, the polysilicon layer pattern 320 in the thin film transistor region II and in the first electrode 329 of the capacitor region III are doped with impurities on the gate insulating layer 330. At this time, source and drain regions 326 and 324 are formed in the thin film transistor region II. Further, a channel region 322 is formed between the source and drain regions 326 and 324.

Then, a conductive layer (not shown) for a gate electrode is formed on the entire surface of the resultant structure. The conductive layer for the gate electrode is formed of a single layer of molybdenum (Mo) or an alloy such as molybdenum-tungsten (MoW), a single layer of aluminum (Al) or an alloy such as aluminum-neodymium (Al—Nd), or a double layer of the above-mentioned metals. Then, the conductive layer for the gate electrode is etched by photolithography and etching processes, thus forming the second dummy pattern 336, the gate electrode 332 and the second electrode 334 in the emission region I, the thin film transistor region II and the capacitor region III, respectively. In the case where a thin film transistor is an n-channel metal oxide semiconductor (NMOS), impurity ions can be lightly doped using the gate electrode 332 as an ion implantation mask, thus forming a lightly-doped drain (LDD) region (not shown).

Then, an interlayer insulating layer 340 is formed on the entire surface of the resultant structure. Subsequently, the interlayer insulating layer 340 and the gate insulating layer 330 are etched by photolithography and etching processes, thus forming a contact hole for exposing the source and drain regions 326 and 324. Then, a material for forming source and drain electrodes is formed on the interlayer insulating layer 340.

Then, the source and drain electrode material is etched by photolithography and etching processes, thus forming the third dummy pattern 356, the source and drain electrodes 350 and 352 and the third electrode 354 in the emission region I, the thin film transistor region II and the capacitor region III, respectively. Here, the source and drain electrodes 350 and 352 are connected to the source and drain regions 326 and 324.

Next, a passivation layer 360 and a planarization layer 370 are formed on the entire surface of the resultant structure. Then, the planarization layer 370 and the passivation layer 360 are etched by photolithography and etching processes, thus forming a via contact hole which exposes one of the source and drain electrodes 350 and 352. In FIG. 2, the drain electrode 352 and not the source electrode 350 is shown to be exposed by the via contact hole.

Then, a pixel electrode 380 is formed to be connected to the drain electrode 352 through the via contact hole. At this time, the pixel electrode 380 is made of a reflective material. Here, the pixel electrode 380 can be formed of a single layer of the reflective material or a laminated layer that includes a reflective electrode. The single layer of the reflective electrode can include Ag or an Ag alloy. The laminated layer can include a structure of transparent/reflective/transparent electrodes or reflective/transparent electrodes, wherein the reflective electrode can include Ag or an Ag alloy, and the transparent electrode can include indium tin oxide (ITO), indium zinc oxide (IZO) or $In_2O_3$. Because the reflective electrode is employed as the pixel electrode 380, the pixel electrode 380 can be provided only in the emission region I. Alternatively, the pixel electrode 380 can extend into the thin film transistor region II and the capacitor region III.

Then, a pixel defining layer 390 is formed on the entire surface of the resultant structure, thus exposing a portion of the pixel electrode 380 in the emission region I. At this time, the pixel defining layer 390 is formed to a thickness of 3,000 Å or less in the emission region I to thus facilitate the following organic layer forming process.

Then, an organic layer (reference numeral 430 in FIG. 3) including at least the emission layer is formed on the pixel electrode 380. Further, the organic layer can further include at least one layer among a hole injection layer, a hole transporting layer, an electron transporting layer, and an electron injection layer. Also, the organic layer can be formed by an LITI method.

The LITI method is performed as follows. The substrate 300 is disposed opposite to the donor substrate that includes the base substrate 400, the light-to-heat conversion layer 410 and the transfer layer 420, and then arranged and laminated. Radiation from a laser is applied to the base substrate 400 of the laminated donor substrate, thus transferring the transfer layer 420 under the light-to-heat conversion layer 410 to the exposed portion of the pixel electrode 380 on substrate 300. Preferably, the distance T2 between the transfer layer 420 of the donor substrate and the pixel electrode 380 is 3,000 Å or less, allowing for less laser energy needed for transferring the transfer layer 420. Then, an opposite electrode 440 is formed over the transferred structure and an encapsulation process is performed, thus completing the organic light emitting display device.

Turning now to FIG. 3, FIG. 3 is a view of the finished organic light emitting display produced by the method of FIG. 2. As illustrated in FIG. 3, the organic layer 430 is arranged on top of the pixel defining layer 390 and on top of the previously exposed portion of pixel electrode 380. The organic layer was previously the transfer layer 420 of FIG. 2. The organic layer 430 contains an emission layer and can also include one or more of a hole injection layer, a hole transporting layer, an electron transporting layer and an electron injection layer. On top of the organic layer 430 is the opposite electrode 440.

As illustrated in FIG. 3, the final product does not have a perfectly flat top surface but instead contains relief (or differences in height) across the top surface caused by the aperture that once exposed a portion of the pixel electrode 380 as well as the valley formed between the capacitor region and the thin film transistor region.

As described above, according to the present invention, the dummy pattern is formed under the pixel electrode of the emission region so as to increase the step difference, and thus minimize the distance between the pixel electrode and the donor substrate when the organic layer is formed, thus minimizing the laser energy needed for the transfer, and enhancing the efficiency of the laser energy during the LITI process. As the laser energy is minimized, the life span and efficiency of the emission layer are improved. Further, the pixel electrode can extend to the thin film transistor region and the capacitor region, thus improving an aperture ratio.

Although the present invention has been described with reference to certain exemplary embodiments thereof, it will be understood by those skilled in the art that a variety of modifications and variations can be made to the present invention without departing from the spirit and scope of the present invention.

What is claimed is:

1. An organic light emitting display device, comprising:
    an emission region including a pixel electrode, an organic layer that includes at least an emission layer, and an opposite electrode on a substrate, the emission region being defined by a pixel defining layer, a dummy pattern being arranged in the emission region under the pixel electrode;
    a thin film transistor region including a gate electrode and source and drain electrodes; and
    a capacitor region including a lower electrode and an upper electrode, the dummy pattern being adapted to increase a step height of the emission region.

2. The organic light emitting display device of claim 1, wherein the pixel electrode includes a reflective electrode, and the opposite electrode includes a transparent electrode.

3. The organic light emitting display device of claim 1, wherein the pixel electrode extends into the thin film transistor region and into the capacitor region.

4. The organic light emitting display device of claim 1, wherein the organic layer further includes at least one layer selected from the group consisting of a hole injection layer, a hole transporting layer, a hole blocking layer, an electron transporting layer and an electron injection layer.

5. The organic light emitting display device of claim 1, wherein the dummy pattern has a laminated structure of at least two materials selected from the group consisting of a polysilicon layer pattern, a gate electrode material, and source and drain electrode materials.

6. The organic light emitting display device of claim 1, wherein the pixel defining layer has a thickness of 3,000 Å or less.

7. An organic light emitting display (OLED) device, comprising:
    an emission region including a pixel electrode, an organic layer that includes at least an emission layer, and an opposite electrode on a substrate, the emission region being defined by a pixel defining layer, a height between a top surface of the pixel defining layer and a top surface of the pixel electrode being no more than 300 nm, a dummy pattern being arranged in the emission region under the pixel electrode;
    a thin film transistor region including a gate electrode and source and drain electrodes; and
    a capacitor region including a lower electrode and an upper electrode.

8. The OLED device of claim 7, the pixel defining layer being perforated by an aperture exposing a portion of the pixel electrode within the pixel region, the aperture being no more than 300 nm deep.

9. The OLED device of claim 8, the pixel defining layer perforated by the aperture, the top surface of the pixel defining layer not being flat.

10. The OLED device of claim 7, each of the capacitor region, the thin film transistor region and the emission region being arranged side by side with each other and not on top of one another.

11. The OLED device of claim 7, a top surface of the pixel defining layer being 300 nm above the top surface of an exposed portion of the pixel electrode.

12. The OLED device of claim 7, wherein the organic layer further includes a layer selected from a group consisting of a hole injection layer, a hole transporting layer, an electron transporting layer and an electron injection layer.

13. The OLED device of claim 7, the organic layer being transferred from a donor substrate to an exposed portion of the pixel electrode.

14. The OLED device of claim 7, wherein a height between a top surface of the pixel defining layer and a top surface of the pixel electrode is 300 nm.

* * * * *